(12) United States Patent
Schnayderman

(10) Patent No.: US 6,299,749 B1
(45) Date of Patent: Oct. 9, 2001

(54) METHOD OF FABRICATING AN ELECTRICAL COMPONENT

(75) Inventor: Gary Schnayderman, Naperville, IL (US)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 09/426,261

(22) Filed: Oct. 25, 1999

(51) Int. Cl.⁷ ................................................. C25D 5/02
(52) U.S. Cl. ................................................... 205/118
(58) Field of Search .................... 205/118, 122, 205/183

(56) References Cited

U.S. PATENT DOCUMENTS

| | | | |
|---|---|---|---|
| 4,096,043 | * 6/1978 | De Angelo | 204/15 |
| 4,174,261 | * 11/1979 | Pellegrino | 204/273 |
| 4,242,369 | 12/1980 | Mansukhani | 427/47 |
| 4,717,639 | * 1/1988 | Dubin et al. | 430/124 |
| 4,767,489 | 8/1988 | Lindner | 156/345 |
| 5,275,689 | 1/1994 | Felten et al. | 156/628 |
| 5,382,315 | 1/1995 | Kumar | 156/643 |
| 5,393,580 | 2/1995 | Ma et al. | 428/29 |
| 5,494,781 | 2/1996 | Ohitani et al. | 430/313 |
| 5,626,483 | 5/1997 | Naitoh | 439/74 |
| 5,637,426 | 6/1997 | Uchikawa | 430/9 |
| 5,721,007 | 2/1998 | Lynch et al. | 427/98 |
| 5,839,188 | 11/1998 | Pommer | 29/830 |
| 5,902,471 | * 5/1999 | Jordan et al. | 205/122 |

* cited by examiner

*Primary Examiner*—Kathryn Gorgos
*Assistant Examiner*—Erica Smith-Hicks
(74) *Attorney, Agent, or Firm*—Robert J. Zeitler

(57) ABSTRACT

A method of fabricating an electrical component includes the steps of providing a three-dimensional metal electrical component having multiple sides. A coating material is applied simultaneously to a plurality of the sides of the multi-sided component over a predetermined first portion thereof. A highly conductive plating material is applied to a second portion of the component not covered by the coating material. The coating material then is removed from the plurality of sides of the first portion of the component.

23 Claims, 5 Drawing Sheets

METHOD OF FABRICATING AN ELECTRICAL COMPONENT

FIELD OF THE INVENTION

This invention generally relates to the art of electrical connections and, particularly, to a method of fabricating an electrical component, such as a metal terminal.

BACKGROUND OF THE INVENTION

A typical electrical connector includes some form of dielectric housing for mating with a complementary connecting device, such as a mating connector. The housing may be adapted for mounting on a printed circuit board, with a receptacle for mating with the complementary connector, or the housing may receive a second printed circuit board in a board-to-board connection. Whatever the connector configuration, the dielectric housing typically mounts a plurality of conductive terminals or contacts.

An electrical terminal normally includes a terminating portion or end and a contact portion or end. The terminating end is terminated to an electrical wire, a circuit trace on a printed circuit board, a conductor strip on a flat flexible cable or any other conductor of an appropriate electrical device. The contact end of the terminal is adapted for engaging a contact or a contact portion of a terminal of the electrical device to which the connector is mated or interfaced, such as the complementary mating connector. It is frequently desirable to plate the contact portion or end of the terminal with a highly conductive material, such as a precious metal like gold. For obvious cost considerations, the entire terminal preferably is not plated but only the contact portion. In addition, the body or thickness of the terminal is not fabricated of such highly conductive materials as gold, because of the cost and such materials do not provide the resiliency necessary for most terminals. It should be understood, however, the invention herein is not limited to electrical terminals and is equally applicable and advantageous for fabricating a variety of electrical components whether the base material is conductive or non-conductive.

With that understanding, contact portions of some electrical terminals are easily plated with plating material when the contact portions of the terminals are at extreme or distal ends of the terminal configurations. Those ends simply are dipped or immersed in an electrolytic bath to cover the end contact portions and the plating material is electro-plated on those ends. Still with this method, plating material is plated on unnecessary portions of the terminals such as portions that do not contact the mating terminal. Moreover, in many applications, the contact portions of the terminals are not at ends or edges thereof, and the dipping process cannot be used. In those applications, a mechanical masking device is applied to the terminals to screen areas not to be plated, leaving the contact portions of the terminals exposed. The terminals then are immersed in an electro-plating bath, and only the contact portions of the terminals become plated. Problems continue to occur in designing systems or processes for applying mask materials to such electrical components, particularly when the components are three-dimensional. For instance, an ink-jet type process or applicator has been used for applying the mask material, but such processes have been limited primarily to applications where the mask material is applied to one side of a substrate, sheet or film which has a portion or spot to be plated. Such processes have not been used for applying mask materials to a plurality of sides of a multi-sided electrical component. The present invention is directed to solving these problems and providing a process for applying the printing material to three-dimensional electrical components, such as electrical terminals.

SUMMARY OF THE INVENTION

An object, therefore, of the invention is to provide a new and improved method of fabricating an electrical component.

Another object of the invention is to provide a new and improved method of applying a conductive or non-conductive printing material to a plurality of sides of a multi-sided electrical component.

In the exemplary embodiment of the invention, the method includes the steps of providing a three-dimensional electrical component having multiple sides. A coating material is applied by a printing process to a plurality of the sides of the multi-sided electrical component over a predetermined first portion thereof. A highly conductive plating material is applied to a second portion of the component not covered by the coating. The coating material then is preferably removed from the plurality of sides of the first portion of the electrical component leaving the second portion plated.

Alternatively, the coating material can be applied by a printing process to a first portion of a multi-sided electrical component and be excluded from a second portion of the component. The highly conductive plating material is then applied to the first portion of the component.

As disclosed herein, the electrical component is preferably a metal terminal for an electrical connector. The coating material is applied by an ink-jet process which includes employment of one or more ink-jet heads directed toward the plurality of sides of the first portion of the electrical component.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF A PREFERRED EMBODIMENT

Figure 1:
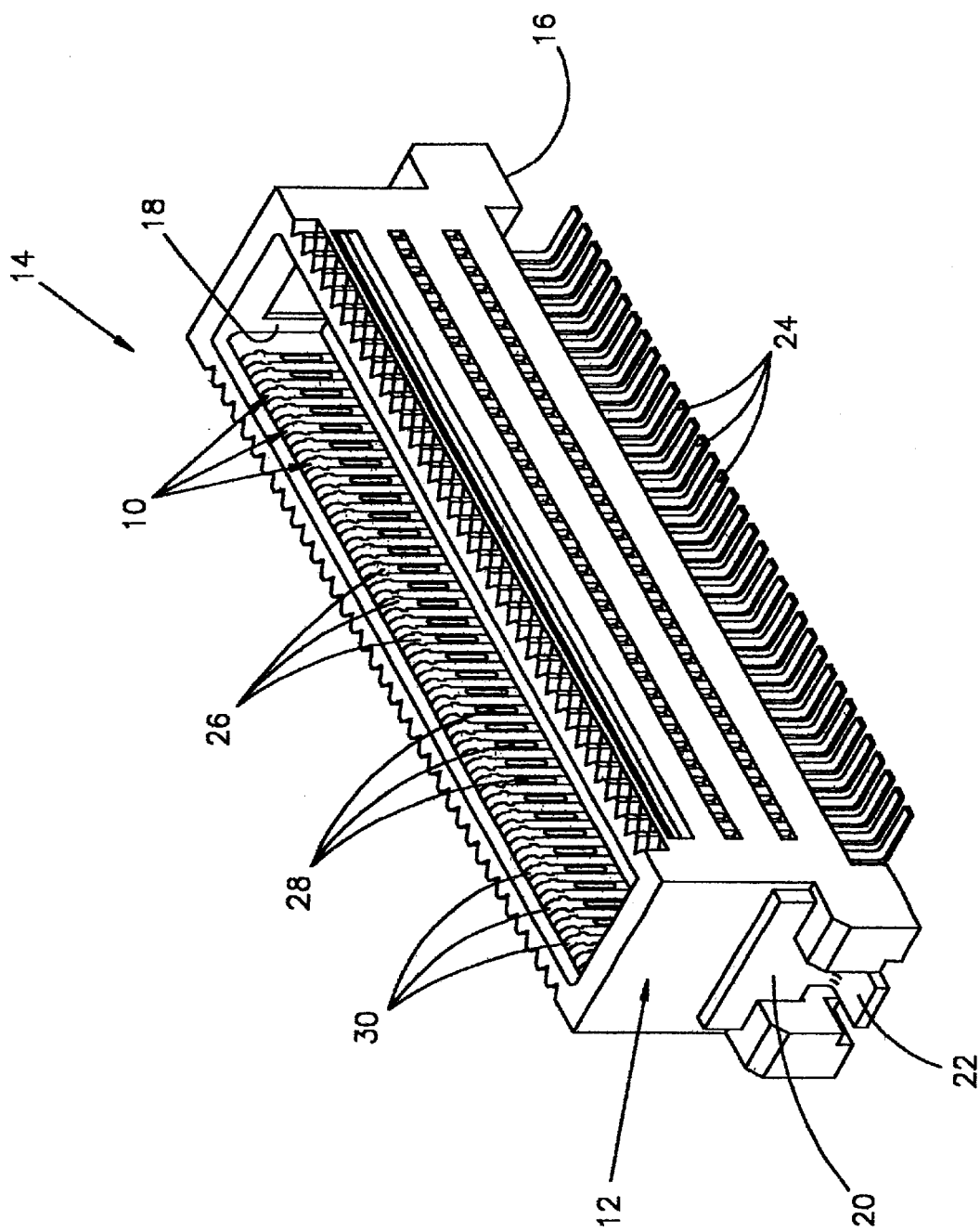
FIG. 1 is a perspective view of an electrical connector including a plurality of terminals which can be fabricated according to the method of the invention.

Referring to the drawings in greater detail, and first to FIG. 1, the invention is disclosed in conjunction with the fabrication of a plurality of conductive terminals, generally designated 10, which are mounted in a dielectric housing, generally designated 12, of an electrical connector, generally designated 14. However, it should be understood that the method of the invention is applicable for fabricating a wide variety of conductive or non-conductive electrical components, and the following explanation of the invention as applied to terminals 10 of connector 14 is for illustration purposes only.

With that understanding, housing 12 of connector 14 has a mounting surface 16 for mounting on a printed circuit board. The opposite side (the top side as viewed in FIG. 1) has an elongated receptacle 18 for receiving a plug portion of a complementary mating connector, for instance. Connector 14 could be adapted for receiving a second printed circuit board in a board-to-board interface. A metal fitting nail 20 is mounted to each end of housing 12 and includes a foot portion 22 for securing, as by soldering, to a mounting pad on the printed circuit board to which the connector is mounted.

Each terminal 10 includes a foot or solder tail portion 24 extending outwardly and at a right angle to a contact arm 26. The terminals have right-angular configurations so that solder tails 24 project outwardly from housing 12 generally flush with mounting surface 16 of the housing, and contact arms 26 project upwardly into receptacle 18 along opposite sides thereof The solder tails are connected, as by soldering, to appropriate circuit traces on the printed circuit board to which the connector is mounted. The contact arms have contact portions 28 exposed at opposite sides of receptacle 18 for engaging appropriate contacts of the complementary mating connector or appropriate circuit traces on a second printed circuit board, whichever is inserted into receptacle 18. Finally, terminals 10 include top portions 30 which are bent outwardly from the distal ends of contact arms 26.

Figure 2:
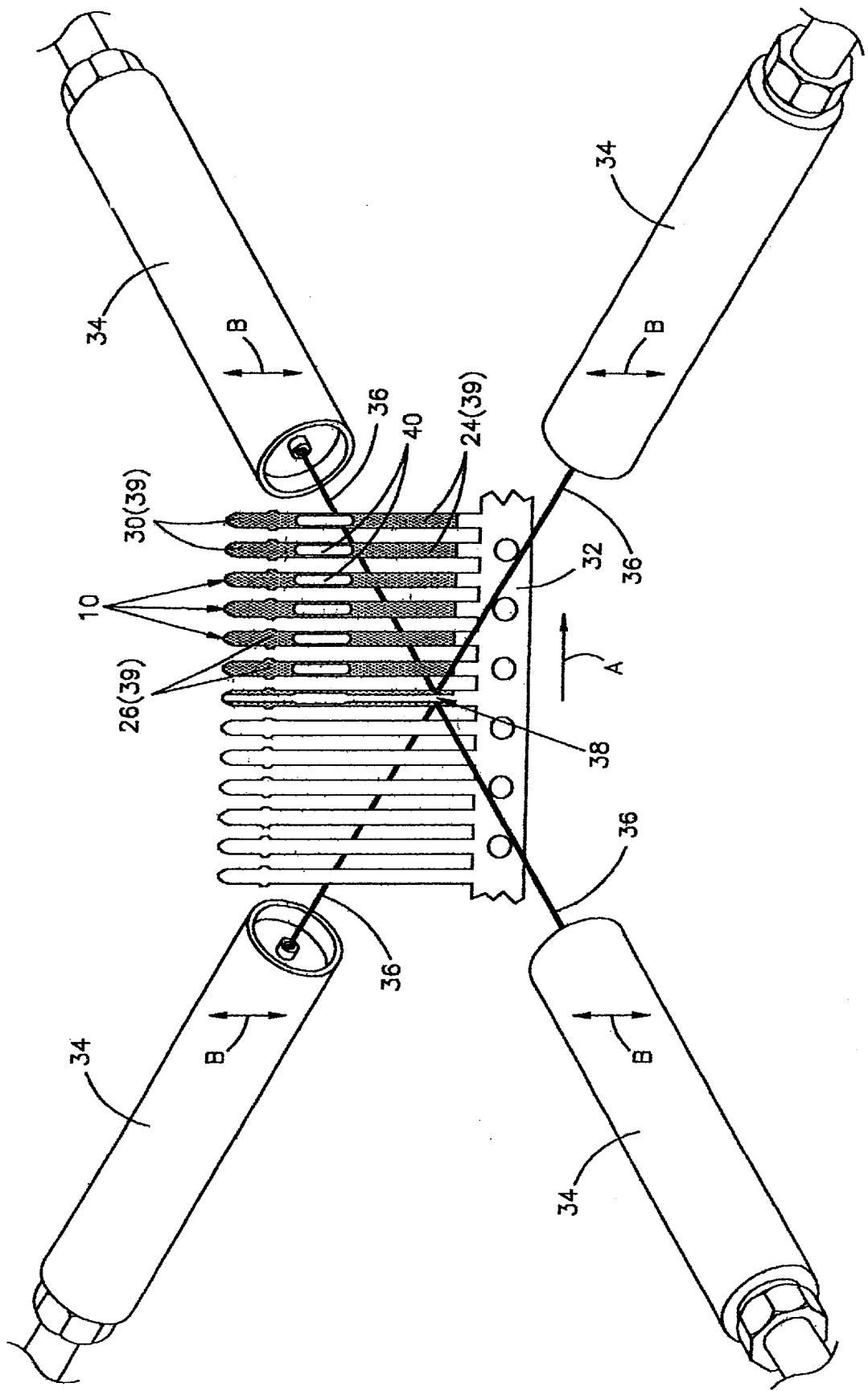
FIG. 2 is a perspective view of four ink-jet heads applying the coating material to a plurality of sides of one of a plurality of terminals.

Terminals 10 are stamped and formed from conductive sheet metal material, and FIG. 2 shows a plurality of the terminals stamped from the sheet metal material and prior to forming solder tails 24, contact arms 26 and distal ends 30 as described above in relation to their final configurations shown in FIG. 1. Alternatively, the terminals 10 can be formed to have some or all of their final configuration prior to plating. The terminals are shown in FIG. 2 still connected to a carrier strip 32 which indexes the terminals through the various stamping and other steps in the process of fabricating the terminals. FIG. 2 shows the step of applying a coating material to the terminals.

Figure 3:
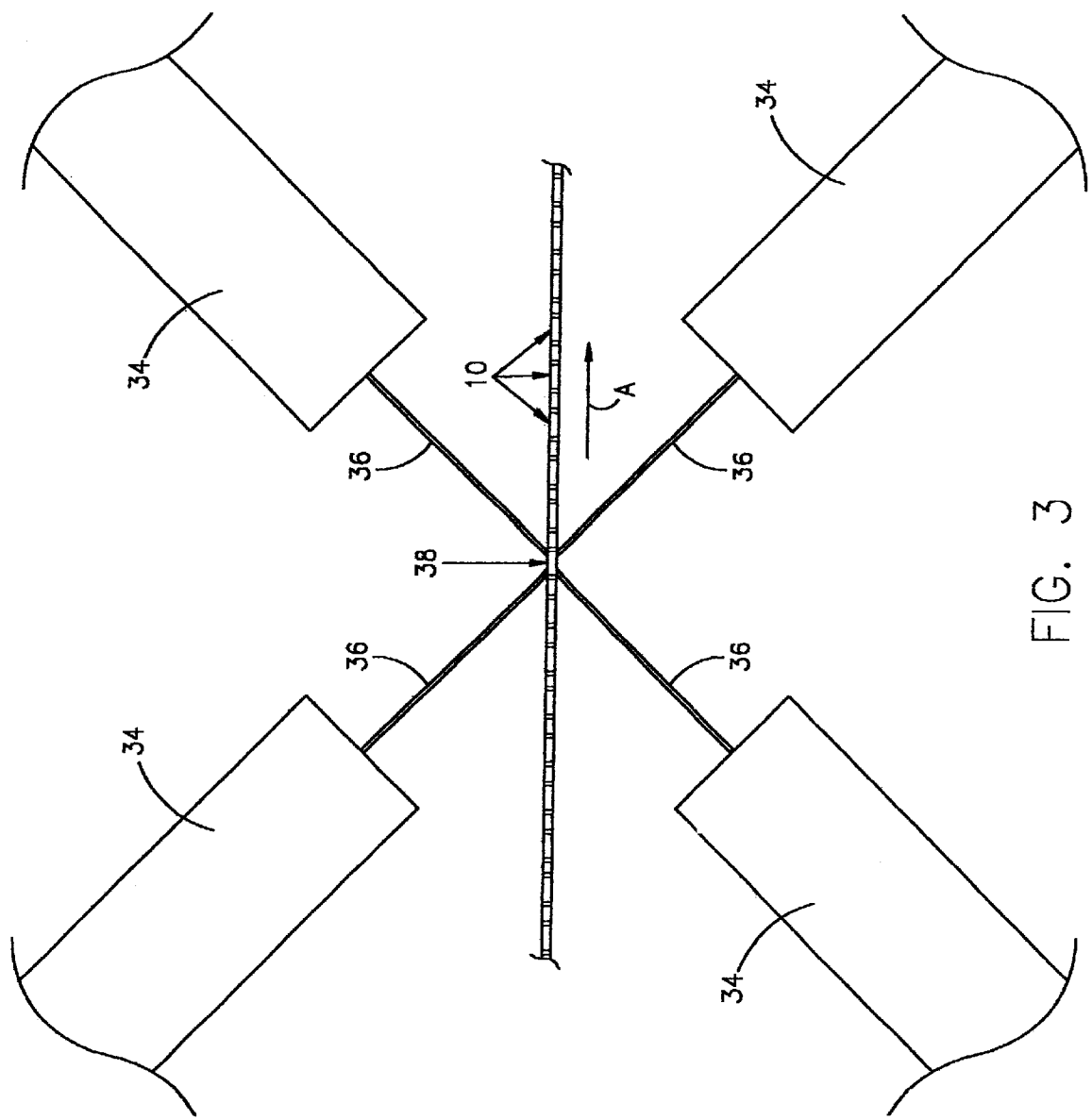
FIG. 3 is a top plan view of the depiction in FIG. 2.

More particularly, FIG. 2 shows a plurality of ink-jet heads 34 which are angularly oriented in order to direct a plurality of angularly oriented jet streams of a coating material toward a particular target terminal 38. As seen best in FIG. 3, the ink-jet heads are disposed in four quadrants equally spaced circumferentially about target terminal 38, whereby jet streams 36 of the coating material are directed at right angles to each other toward target terminal 38. However, it is contemplated that separate ink-jet heads 34 could be directed toward separate target terminals 38. For the embodiment described, the coating material should be non-conductive during plating to create a mask which prohibits electroplating on the coated portion. On the other hand, if electroplated metal will be applied to the coating, the coating material should be conductive during electrochemical plating. The conductivity of the coating will not be as critical if the component will be plated by an electroless process. Moreover, the material must have a controlled viscosity and be printable so as to be suitable for ink-jet processes.

Referring to FIG. 2, carrier strip 32 moves terminals 10 in the direction of arrow "A" into the position of the target terminal 38 at the intersection of jet streams 36. This might be considered the horizontal direction. In an embodiment, ink-jet heads 34 are appropriately movable generally in the vertical direction as indicated by double-headed arrows "B" and in variations of the vertical direction as dictated by an appropriate computer software driven control system. The computer software is specially programmed for the particular configuration of the electrical component to which the coating material is to be applied, such as terminals 10. It can be understood that terminals 10 are stamped from the conductive sheet metal material, resulting in two opposite sides and two opposite stamped edges or four "sides" defining a three-dimensional structure. Consequently, four ink-jet heads 34 are used to direct four jet streams 36 toward the four sides of the three-dimensional terminal. It can be seen in FIG. 2 that first portions of the terminals on the outside of the target terminal 38 are shaded to indicate that a coating material 39 has been applied thereto by the ink-jet heads. A second portion 40 of each terminal is not masked by the coating material, and these second portions of the terminals subsequently will become the contact portions 28 thereof. It should be understood that fewer or greater numbers of ink-jet heads could be used depending on the configuration of the print system and the portions of the terminal to which the coating must be applied.

Figure 4:
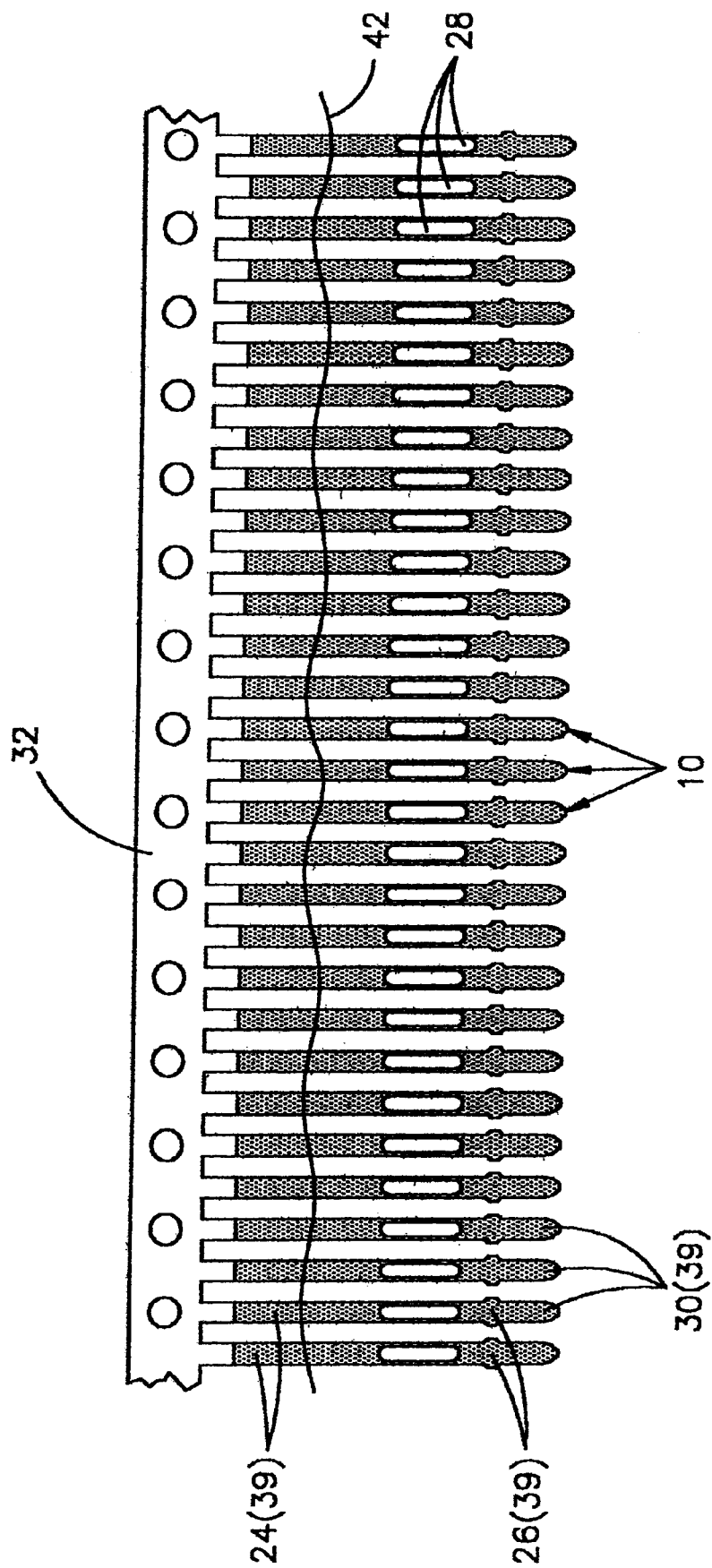
FIG. 4 is a view showing the terminals after having the coating material applied thereto, with the terminals immersed in an electro-plating bath to a depth to at least cover the contact portions of the terminals.

FIG. 4 shows all of a plurality of terminals 10 joined to carrier strip 32 having been immersed into an electro-plating bath 42 wherein contact portions 28 are plated with a highly conductive material such as gold. Of course, in the described embodiment, with solder tails 24, contact arms 26 and distal ends 30 of the terminals being masked by the coating material, electro-plating in these areas will be resisted or prevented.

Figure 5:
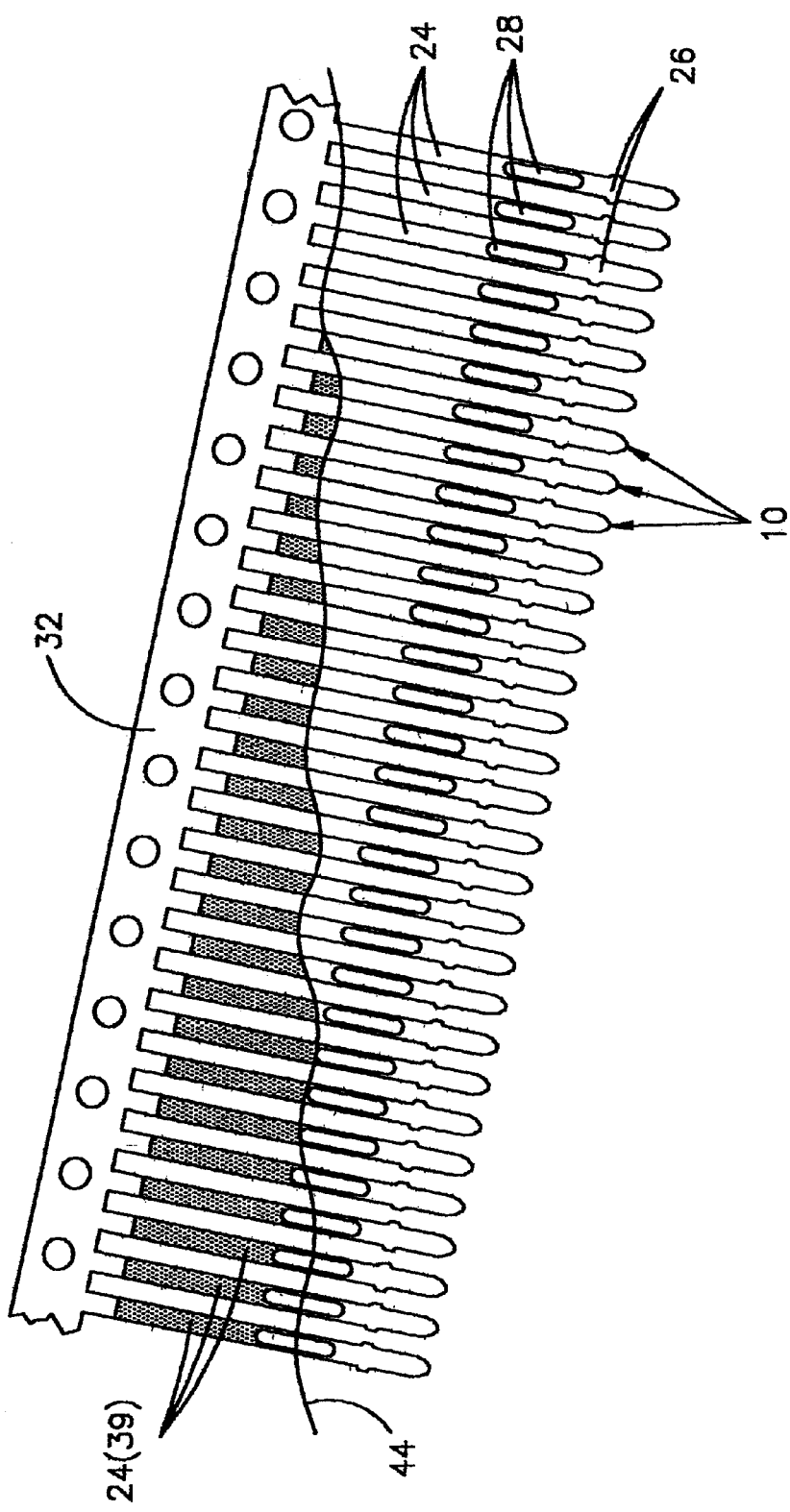
FIG. 5 is a view showing the terminals being immersed in a bath for removing the coating material.

After contact portions 28 have been plated with the highly conductive material as described in relation to FIG. 4, terminals 10 which are still joined to carrier strip 32 then are immersed into a bath 44 of a solvent material which is effective to remove coating material 39 from the terminals, leaving the terminals clean with plated contact portions 28 as seen toward the right-hand end of FIG. 5. Carrier strip 32 then can be used to index the terminals through an appropriate forming machine whereat solder tails 24 and distal ends 30 can be formed or bent in opposite directions away from contact arms 26 as described above in relation to FIG. 1. Of course, some of the forming procedures can be performed either before or after the terminals are inserted into housing 12.

Although the preferred embodiment has been described to include a plating resist as the coating material, it is also contemplated that the coating material applied to the electrical component could enable plating on the coating material or on the portion of the component to which the coating material was applied.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What is claimed is:

1. A method of fabricating an electrical component, comprising the steps of:

providing a three-dimensional electrical component having multiple sides;

printing a coating material to a plurality of the sides of the multi-sided electrical component over a predetermined first portion thereof; and applying a highly conductive plating material by an electroplating technique to a second portion of the component not covered by the coating material.

2. The method of claim 1 wherein said three-dimensional electrical component is provided as a metal terminal for an electrical connector.

3. The method of claim 1 wherein said coating material is applied by an ink-jet process.

4. The method of claim 3 wherein coating material is applied by a plurality of ink-jet heads directed toward the plurality of sides of said first portion of the electrical component.

5. The method of claim 4 wherein said coating material is applied by said plurality of ink-jet heads oriented to direct jet streams of the coating material toward said first portion of the electrical component.

6. The method of claim 1 wherein said coating material is provided of a non-conductive material.

7. The method of claim 1 including the step of removing the coating material from the plurality of sides of the first portion of the electrical component.

8. The method of claim 1 wherein said highly conductive plating material is applied in an electro-plating bath.

9. The method of claim 7 wherein said coating material is removed by a solvent.

10. The method of claim 8 wherein said coating material is removed by immersing the plated electrical component in a bath of said solvent.

11. The method of claim 1 wherein said three-dimensional electrical component is made of plastic.

12. A method of fabricating an electrical component, comprising the steps of:

providing a three-dimensional electrical component having multiple sides;

applying a coating material by an ink-jet process simultaneously to a plurality of the sides of the multi-sided electrical component over a predetermined first portion thereof; and at least partially immersing the component in an electroplating bath to apply a highly conductive plating material to a second portion of the component not covered by the coating material.

13. The method of claim 12 wherein said three-dimensional electrical component is provided as a metal terminal for an electrical connector.

14. The method of claim 12 wherein coating material is applied by a plurality of ink-jet heads directed toward the plurality of sides of said first portion of the electrical component.

15. The method of claim 14 wherein said coating material is applied by said plurality of ink-jet heads oriented to direct jet streams of the coating material toward said first portion of the electrical component.

16. The method of claim 12 wherein said coating material is provided of a non-conductive material.

17. The method of claim 12 including the step of at least partially immersing the component in a bath to remove the coating material from the plurality of sides of the first portion of the electrical component.

18. The method of claim 12 wherein said coating material is removed in a bath of solvent material.

19. The method of claim 12 wherein said three-dimensional electrical component is made of plastic.

20. A method of fabricating an electrical component, comprising the steps of:

providing a three-dimensional electrical component having multiple sides;

applying a coating material by an ink-jet process to a first portion of the multi-sided electrical component and excluding said material from a second portion of the multi-sided electrical component;

at least partially immersing the component in an electroplating bath to apply a highly conductive plating material to one of said first portion and a second portion of the component.

21. The method of claim 20 including the step of at least partially immersing the three-dimensional electrical component in a bath to remove the coating material from the three-dimensional electrical component.

22. The method of claim 20 wherein said three-dimensional electrical component is made of metal.

23. The method of claim 20 wherein said three-dimensional electrical component is made of plastic.

* * * * *